(12) United States Patent
Kaushik et al.

(10) Patent No.: US 6,541,280 B2
(45) Date of Patent: Apr. 1, 2003

(54) HIGH K DIELECTRIC FILM

(75) Inventors: Vidya S. Kaushik, Leuven (BE);
Bich-yen Nguyen, Austin, TX (US);
Srinivas V. Pietambaram, Gainesville, FL (US); James Kenyon Schaeffer, III, Austin, TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/811,656

(22) Filed: Mar. 20, 2001

(65) Prior Publication Data

US 2002/0137317 A1 Sep. 26, 2002

(51) Int. Cl.$^7$ ............................................. H01L 21/00
(52) U.S. Cl. ........................ 438/3; 438/585; 361/311; 361/321.4
(58) Field of Search ............................ 438/3, 573, 605, 438/618, 761

(56) References Cited

U.S. PATENT DOCUMENTS

| | | | |
|---|---|---|---|
| 4,879,079 A | * 11/1989 | Hsieh | 264/56 |
| 5,159,413 A | 10/1992 | Calviello et al. | |
| 5,471,364 A | * 11/1995 | Summerfelt et al. | 361/321.4 |
| 5,665,628 A | 9/1997 | Summerfelt | 438/3 |
| 5,910,880 A | * 6/1999 | DeBoer et al. | 361/311 |
| 5,940,698 A | 8/1999 | Gardner et al. | 438/197 |
| 6,060,755 A | 5/2000 | Ma et al. | |
| 6,069,387 A | 5/2000 | Gardner | 257/344 |
| 6,153,477 A | 11/2000 | Gardner et al. | 438/286 |
| 6,255,122 B1 | * 7/2001 | Duncombe et al. | 438/3 |

2001/0032995 A1   10/2001   Maria et al.

FOREIGN PATENT DOCUMENTS

| | | |
|---|---|---|
| EP | 1 089 344 A2 | 4/2001 |
| WO | WO 01/40541 A1 | 6/2001 |
| WO | WO 01/54200 A1 | 7/2001 |

OTHER PUBLICATIONS

Carlson, C.M. et al., "Laser–ablated epitaxial LaAlO$_3$ buffer layers on biaxially textured Ni substrates for superconducting tapes," *Physica C, 1998,* pp. 82–88, vol. 304, Elsevier Science B.V.

Molodyk, Alexander A., "Volatile Surfactant–Assisted MOCVD: Application to LaAlO$_3$ Thin–Film Growth**," *Chemical Vapor Deposition,* 2000, pp. 133–138, vol. 6(3), Wiley–VCH Verlag GmbH, D–69469 Weinheim.

PCT/US01/49159 International Search Report mailed Aug. 12, 2002.

* cited by examiner

*Primary Examiner*—David Nelms
*Assistant Examiner*—Dung A Le
(74) *Attorney, Agent, or Firm*—James L. Clingan, Jr.; Kim-Marie Vo

(57) ABSTRACT

A dielectric layer comprises lanthanum, aluminum and oxygen and is formed between two conductors or a conductor and substrate. In one embodiment, the dielectric layer is graded with respect to the lanthanum or aluminum. In another embodiment, an insulating layer is formed between the conductor or substrate and the dielectric layer. The dielectric layer can be formed by atomic layer chemical vapor deposition, physical vapor deposition, organometallic chemical vapor deposition or pulsed laser deposition.

19 Claims, 3 Drawing Sheets

HIGH K DIELECTRIC FILM

FIELD OF THE INVENTION

This invention relates to devices used in and methods for making integrated circuits, and more particularly to high K dielectrics used in making integrated circuits.

BACKGROUND OF THE INVENTION

Silicon dioxide has been by far the most common and effective insulator used in making integrated circuits. This has a very high level of integrity and, in particular, is able to be made with a very low defect density. The result is that the silicon dioxide operates very effectively in having low leakage. With regard to gate dielectrics, one of the desirable features of the dielectric is that it couple the overlying gate to the underlying channel so that the channel is responsive to the stimulus applied to the gate. In this regard it is desirable for that dielectric to have a high dielectric constant commonly known as K.

Currently there is much work being done in developing high K dielectrics that have a higher dielectric constant than that of silicon oxide. There are a number of those, but one of the advantages of silicon oxide is its high band gap which results in it being a very effective insulator. Thus, many of the materials being developed for high K purposes have been found to have problems because they do not have a high enough band gap or because they are difficult to make with enough integrity to prevent current leakage through the dielectric.

One of the characteristics that is desirable for the high K dielectric is that it be amorphous. It must remain amorphous for its entire life including during manufacturing and subsequently during functional operation as part of the completed integrated circuit. Many of the high K dielectrics have sufficiently high K and sufficient integrity at time of deposition, but over subsequent processing steps and the heating that is associated with that, the result is crystallizing of these films. These films that are so crystallized are not perfectly crystallized throughout their entire length and width but have areas known as grain boundaries between the crystalline structures that are formed. These grain boundaries are areas of leakage and other problems that affect electrical performance.

An alternative to amorphous is monocrystalline films. In theory, these films can be made typically monocrystalline. There are several problems with that. One is matching the crystalline structure of the film with that of the underlying semiconductor, typically silicon, as well as during the formation process that it be in fact perfectly formed. Epitaxial layers, that is layers that are monocrystalline, are known in the industry. Silicon can be made epitaxially. These epitaxial processes generally are relatively slow compared to other deposition processes. One of the techniques by which very small films can be put down in a monocrystalline form is molecular beam epitaxy. There are problems with this approach in that it is very slow so that the throughput, the number of wafers per a period of time, is very low compared to conventional deposition processes such as CVD. Thus, molecular beam epitaxy (MBE) is generally considered not a manufacturable technology. Even with using MBE technology there is still the difficulty of insuring defect free films. In order to achieve this, pressures must be extremely low and the process is very slow. One very thin layer, by thin meaning 10 to 30 angstroms, can easily take 2 hours on an MBE machine.

In developing new high K dielectrics there is also another potential problem of having too high of a dielectric constant. If the dielectric constant is too high, there is an effect that is called fringing field effect which adversely affects the performance of the transistor. This has to do with excessive coupling between the gate and the source/drain. Thus, the materials that are being developed desirably have a range typically between 20 and 40 for the dielectric constant. This range may change somewhat as the technology develops further.

Another aspect of a desirable high K dielectric is in terms of its equivalent capacitance to that of a certain thickness of silicon oxide. Silicon oxide has been so commonly and effectively used that it has become a standard and the industry often describes certain characteristics in terms of its relationship to silicon oxide. In this case, the typical desirable silicon oxide equivalent is between 5 and 15 Angstroms but with silicon oxide of 5 to 15 angstroms it has problems with leakage, reliability and growth rate. Thus, when a film is that small there can be difficulties in manufacturing it as well as using it. The desirable coupling is to have a dielectric that has the equivalence of the thickness of 5 to 15 angstroms of silicon oxide but a greater actual thickness. The actual minimum thickness that is generally believed to be desirable is about 25 Angstroms.

Thus, there is a need for a dielectric film which has a dielectric constant within a desirable range, the ability to be made of high integrity, a thickness in a desirable range, and the ability to be made in a manufacturing process.

DESCRIPTION OF THE INVENTION

A high K dielectric film comprising lanthanum, aluminum and oxide provides an excellent high K material. It combines the advantages of having a desirable range of dielectric constant, the ability to remain amorphous at high temperatures, and provides for low leakage.

Figure 1:
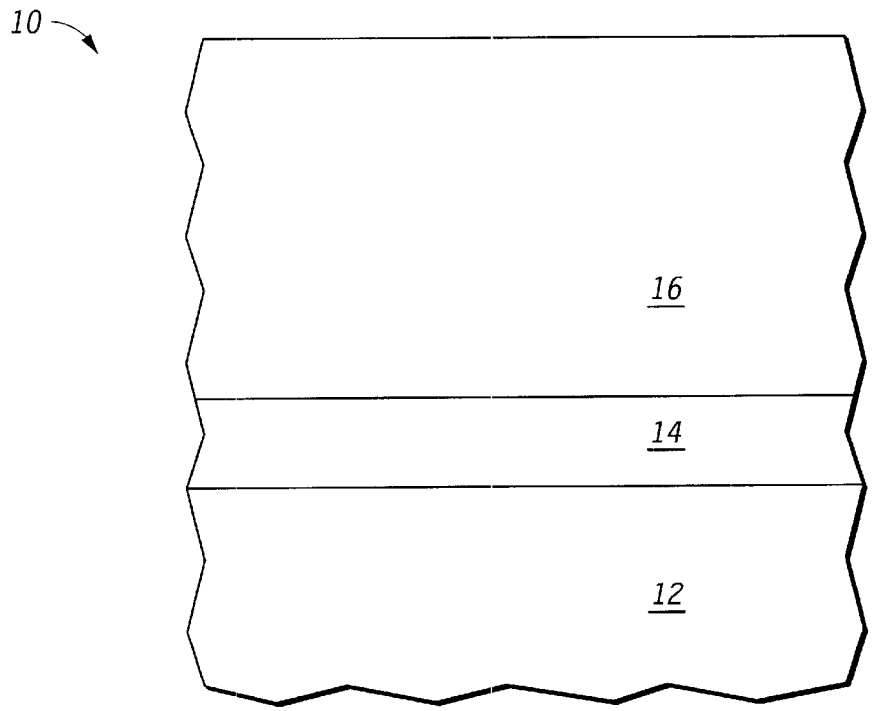
FIG. 1 is a cross section of a portion of an integrated circuit according to a first embodiment of the invention.

Shown in FIG. 1 is a portion 10 of an integrated circuit having a substrate 12 of semiconductor material, a dielectric film 14 and a conductive film 16. Substrate 12 has a semiconductor region at least at a surface thereof. The underlying portion, not shown, can either be also semiconductive material or it can be insulative material which is typical for SOI. Examples of semiconductive material include monocrystalline silicon, gallium arsenide, silicon germanium, and germanium. Over and on substrate 12 is dielectric layer 14. Above and on dielectric layer 14 is conductive film 16 which functions as a gate electrode. Dielectric layer 14 operates as a gate insulator or gate dielectric. Substrate 12, as shown here at the area near the surface at the interface with dielectric film 14, is a channel of a transistor.

Gate dielectric 14 comprises lanthanum aluminate which is a compound comprising lanthanum, aluminum and oxygen. This is written as $LaAlO_3$ when the concentration of aluminum and lanthanum are the same. Gate dielectric 14 is preferably formed using atomic layer chemical vapor deposition (ALCVD). Other methods that may be used include physical vapor deposition, organometallic chemical vapor deposition, and pulsed laser deposition. The ALCVD approach allows for precise control of the formation of the layer including thickness, which in this case is not less than about 25 Angstroms and preferably in the range of 30 to 90 angstroms. Gate conductor 16 in current integrated circuit technology is typically polysilicon but can be other conductors such as tungsten, Ti-nitride, tantalum nitride, or any conductor useful as a gate conductor.

The gate dielectric 14 being deposited by ALCVD is also useful in ensuring that the film is deposited in an amorphous condition. Using current ALCVD technology, a representative temperature range is 200–400 degrees and the pressures are between 0.1 and 10 torr with 1.0 torr being a common choice for ALCVDs. The temperature and pressure are chosen to ensure an amorphous state for gate dielectric 14. In the ALCVD process the aluminum and the lanthanum and the oxygen sources are introduced at different portions of a cycle. Each material has its own point in the cycle where it is introduced and deposited, which occurs by result of a reaction with the existing layer, and then is evacuated, or purged. Subsequently, other material is introduced, reacted with the existing layer and removed by purge. Then the third material is introduced and reacted and purged. A complete cycle is then all three materials but in different points and time in the cycle. It can be viewed also that there would be aluminum then oxygen, lanthanum then oxygen, aluminum then oxygen, etc. Thus, every other step would be the introduction of the oxygen source. Thus in one sense each introduction of a material is a layer of deposition. In this case, each full cycle constitutes four layers of deposition, one lanthanum, one aluminum and two oxygen so that it is layer by layer in deposition but the resulting four layers would be observable as two metal oxide layers, one of aluminum/oxygen and the other as lanthanum/oxygen. These two layers thus comprise a single layer of lanthanum aluminate.

This lanthanum aluminate provides much benefit in the area of optimizing the dielectric coefficient and low leakage. Some other materials have identifiable deficiencies. For example, lanthanum, oxide has a dielectric constant that is in the right range but it absorbs water. The absorption of water is very detrimental to desirable manufacturing of integrated circuits. For example, the absorption of water by lanthanum oxide results in structural integrity problems. It becomes soft which would make it unusable in forming an integrated circuit structure. Aluminum oxide, for example, has a problem of two low of a dielectric constant. The dielectric constant of aluminum oxide is somewhat higher than silicon oxide but is not sufficiently more as to make it usable for continuous scaling. So there may be some solitary process geometry for which aluminum oxide may be usable but subsequent generations, where the dimensions would become smaller, would not be workable.

Another benefit of lanthanum aluminate is that the dielectric constant can be varied based upon the extent of the lanthanum content. Thus, an optimized dielectric constant may be able to be achieved somewhere between 10 and 25. Even somewhat greater coefficients can be obtained where the lanthanum content is even greater than the aluminum content, but this may result in problems associated with water absorption.

The lanthanum aluminate advantageously remains amorphous even at temperatures up to 1,025 and perhaps even more. 1,025 degrees Celsius is a typical highest temperature for current processes. Thus, lanthanum aluminate has been found to withstand the highest temperature that will be received during processing of an integrated circuit that is made by many typical processes for the most advanced geometries and remain amorphous. The desire is for maximum processing temperatures to drop some, but maximum temperatures will likely remain fairly high because the activation of dopants in the source/drains requires a high temperature and such activation is expected to be a requirement for the foreseeable future. Maximum temperatures may drop somewhat below 1,025 but will still be expected to be over 900 degrees Celsius for at least quite some time. There is no certainty, however, that significant lowering of temperatures will occur and 1,025 may continue to be a valid requirement for quite some time. Thus, the amorphous lanthanum aluminate provides the desirable high K characteristics and high integrity over anticipated temperature ranges.

Another benefit of being able to deposit the effective high K dielectric film of amorphous lanthanum aluminate is that is can be very effective, not just on silicon, but also on gallium arsenide. One of the problems in effectively implementing gallium arsenide and its advantage of higher mobility is that the gate dielectrics used in gallium arsenide are very difficult to match the integrity of those of silicon, which are achieved by growing silicon oxide at high temperature. Thus, in most applications silicon has proven to be superior to gallium arsenide. Now with an effective high K dielectric deposited using ALCVD, the result is that the gate dielectric can be of high integrity whether deposited over silicon, gallium arsenide or some other semiconductor material. The result may be that gallium arsenide will become the preferred choice for most integrated circuits and not be just a niche in the semiconductor market that it is now.

Figure 2:
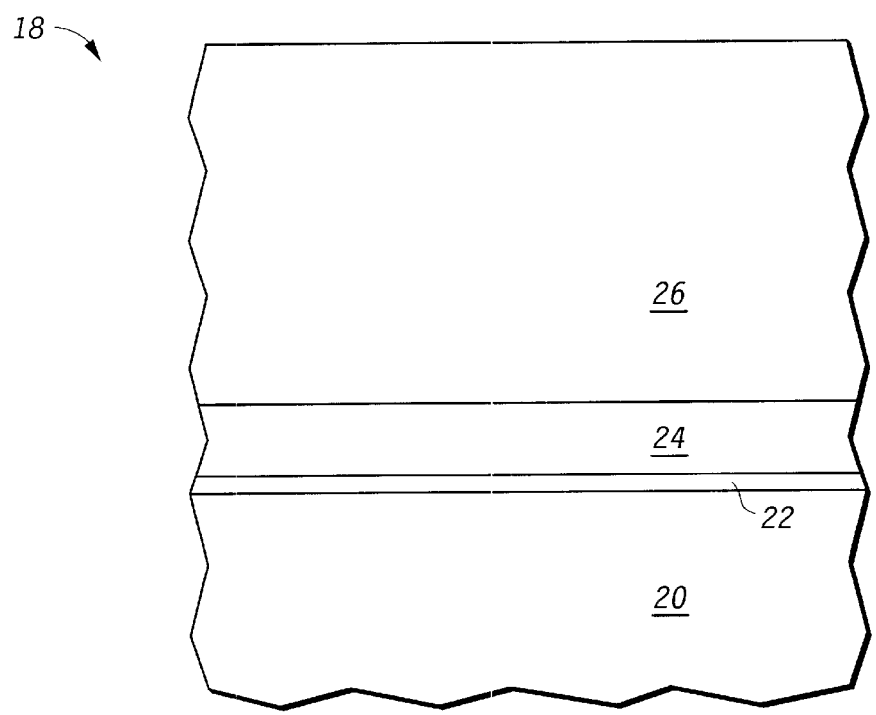
FIG. 2 is a cross section of a portion of an integrated circuit according to a second embodiment of the invention.

Shown in FIG. 2 is a portion 18 of an integrated circuit comprising a substrate 20, a barrier dielectric 22, a high K dielectric 24, and a conductor 26. In this case, high K dielectric 24 is similar or analogous to film 14 of FIG. 1 in that it is lanthanum aluminate. Conductor 26 is analogous to conductor 16 and substrate 20 is analogous to substrate 12 in FIG. 1. Barrier dielectric 22, which may also be referred to as an interfacial layer, is chosen for its desirable characteristics as an insulator. This may be, for example, aluminum oxide, silicon oxide or silicon oxynitride. Aluminum oxide is a particularly good choice for this case because it has excellent insulating characteristics and has a somewhat higher dielectric constant than silicon oxide. Barrier dielectric 22 is present to insure that the combination of high K dielectric 24 and barrier dielectric 22 have sufficient insulation characteristics to prevent unwanted current flow. For example, the combination would have a high band gap and would have a sufficiently high dielectric constant. In particular, this places a high band gap material in direct contact with the substrate 20 which is the potential source of electron injection. Another potential use for barrier dielectric 22 is as diffusion barrier if the material chosen for substrate 20 has a problem with lanthanum aluminate.

Figure 3:
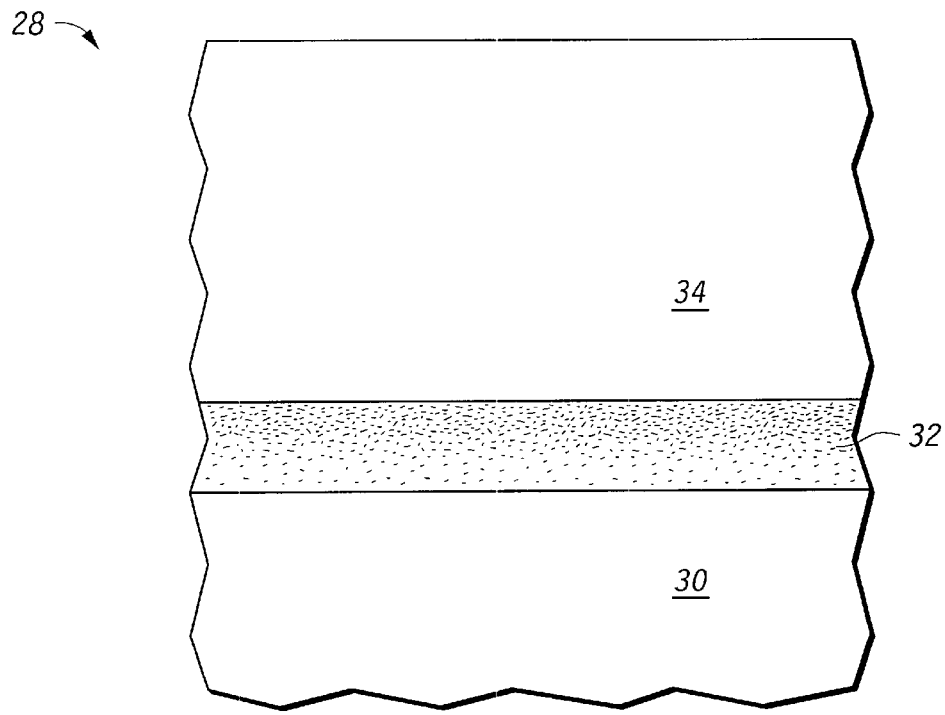
FIG. 3 is a cross section of apportion of an integrated circuit according to a third embodiment of the invention.

Shown in FIG. 3 is a portion 28 of an integrated circuit comprising a substrate 30, a dielectric film 32, and a conductor 34. In this case substrate 30 is analogous to substrates 20 and 12 and conductor 34 is analogous to conductors 26 and 16. Dielectric film 32 substitutes for dielectric 14 and for the combination of dielectrics 22 and 24. In this case dielectric film 32 has a graded concentration of lanthanum. In the dielectric film 32, near the interface with substrate 30, the material is essentially purely aluminum oxide. In moving towards conductor 34 the concentration of lanthanum continuously increases until there is a 1 to 1 ratio between aluminum and lanthanum in the dielectric film 32 near the interface and at the interface with conductor 34. The advantage of this approach is that it provides for the desirable high band gap at immediately next to substrate 30 and avoids any abrupt interfaces between the aluminum oxide and the lanthanum aluminate. The resulting dielectric constant can be adjusted as well by controlling the rate at which the concentration is increased, that is the 1 to 1 ratio between aluminum and lanthanum can be achieved well before the interface with conductor 34. An alternative is for the grading to continue past the one to one ratio so that the concentration of lanthanum exceeds the concentration of aluminum.

In the case of using ALCVD, the initial phases of deposition would not include lanthanum. The first layer would simply be aluminum and oxygen and this could continue for a desired number of layers and lanthanum could be substituted for the aluminum at an increasing rate until the 1 to 1 ratio between lanthanum and aluminum is reached. It may, in fact, be desirable to obtain a higher concentration of lanthanum than aluminum. The risk is that the quality of the film would degrade if the lanthanum became excessive whereas the benefits of the higher concentration of lanthanum in providing a higher dielectric constant may provide for a situation in which, in fact, it is desirable to have more lanthanum than aluminum. In which case, nearest the interface to conductor 34 the lanthanum would be greater than the aluminum in concentration.

Figure 4:
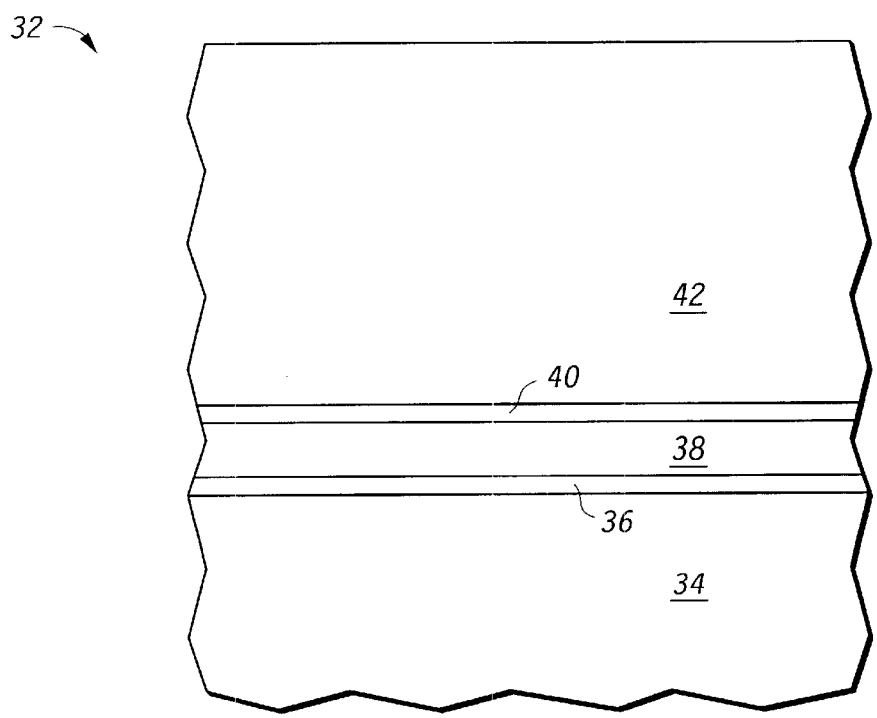
FIG. 4 is a cross section of a portion of an integrated circuit according to a fourth embodiment of the invention.

Shown in FIG. 4 is a portion 32 of an integrated circuit comprising a substrate 34, a barrier dielectric 36, a high K dielectric 38, a barrier dielectric 40 and a conductor 42. In this case, the substrate 34 is analogous to substrates 12, 20 and 30. Barrier dielectric 36 is analogous to barrier 22. High K dielectric 38 is analogous to high K dielectrics 14 and 24. Conductor 42 is analogous to conductors 16, 26 and 34. Barrier layer 40 provides a barrier between high K dielectric 38 and conductor 42. Barrier 40 is for the case in which conductor 42 has a compatibility problem with high K dielectric 38. Barrier 40 would be chosen most likely also among aluminum oxide, silicon oxide, and silicon oxynitride. The purpose of barrier dielectric 40 would be to provide a diffusion barrier between conductor 42 and high K dielectric 38. Of course, it would be desirable for barrier layer 40 to have a high dielectric constant, but its purpose is to prevent problems between conductor 42 and high K dielectric 38. A preferred choice is likely to be aluminum oxide because it has the higher dielectric constant than silicon oxide.

Figure 5:
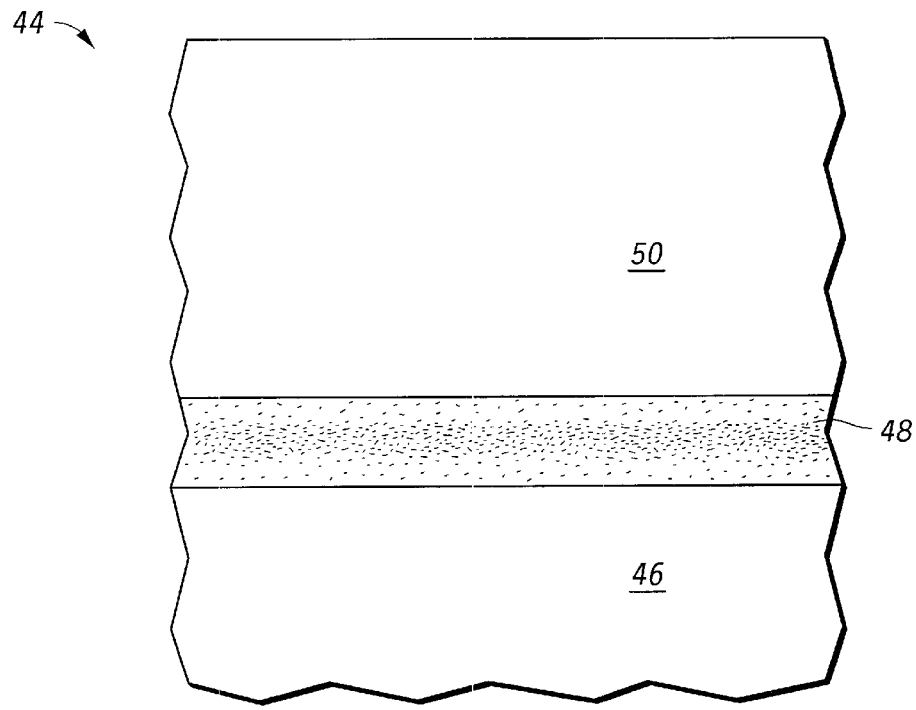
FIG. 5 is a cross section of a portion of an integrated circuit according to a fifth embodiment of the invention.

Shown in FIG. 5 is a portion 44 of an integrated circuit comprising a conductor 46, a high K dielectric 48 and a conductor 50. In this case, the applicability of the high K dielectric is between two conductors. This arises primarily in the case where conductor 46 is a floating gate for storing charge. It can also come up in situations where 46 and 50 comprise capacitor plates which are utilized for storing charge. One such example is the memory cell of a dynamic random access memory. In such a case it is also desirable for high K dielectric 48 to have a high dielectric constant as well as having the desirable characteristics of low leakage.

Shown in FIG. 5, high K dielectric 48 is lanthanum aluminate having a graded concentration. The concentration of lanthanum is maximized in the middle whereas pure or nearly pure aluminum oxide is at the interface with conductor 46 and at the interface of conductor 50. This provides for the relatively high dielectric constant and for high band gap at both the interface with conductor 46 and the interface with conductor 50 so that it is both a high K dielectric and an excellent insulator. By having high K dielectric 48 graded, the sharp interfaces between insulator types is avoided. Sharp transitions between material types tend to be places where charge can be trapped. With a graded concentration the sharp interfaces are avoided. In the case of a transistor, it is most important to have the high band gap only next to the substrate because that is where the charge is potentially injected whereas in the case of portion 44 charge can be injected from either conductor 50 or conductor 46. Thus, it is desirable to have high band gap at the interface with both conductor 50 and conductor 46.

Figure 6:
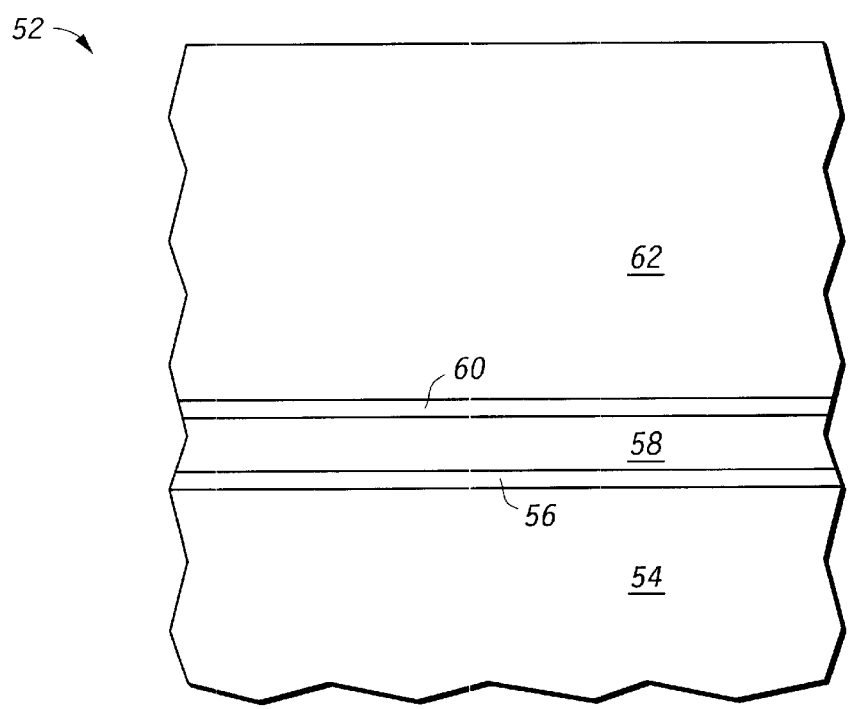
FIG. 6 is a cross section of a portion of an integrated circuit according to a sixth embodiment of the invention.

Shown in FIG. 6 is a portion 52 of an integrated circuit comprising a conductor 54, a barrier dielectric 56, a high K dielectric 58, a barrier dielectric 60 and a conductor 62. This is an analogous structure to FIG. 5. Conductor 54 is analogous to conductor 46 and conductor 62 is analogous to conductor 50 and the combination of layers 56, 58 and 60 is analogous to high K dielectric 48 in FIG. 5. In the case of FIG. 6, dielectric layers 56 and 60 operate both to provide high band gap and as a diffusion barrier between conductors 62 and 54 and high K dielectric 58. Thus, the addition of barrier layers 56 and 60 may be necessary both for sufficient insulation quality as well as providing diffusion barrier to high K dielectric 58. Conductors 54 and 62 may have different characteristics. One may be polysilicon. The other may be a metal in which case the type of barrier dielectric may be desirably different. High K dielectric 58 comprises lanthanum aluminate having the benefits described for lanthanum aluminate for film for the structures of FIGS. 1–5.

The likelihood that barriers will be required in the case of two conductors as distinct from the formation of a transistor is increased because it is, in fact, desirable for injection to occur between conductors 2 and 54 in some circumstances. Thus, the likelihood of needing barriers 56 and 60, or grading as in FIG. 5, so that such injection does not occur when it is undesirable for it to occur is more likely to be a situation that actually happens. Thus, the likelihood of needing barriers 56 and 60, or the grading shown in FIG. 5, is greater in the case where there is a storage of charge by injection. Also, in the case where it is purely acting as a capacitor, it is still more likely to need barrier layers 56 and 60. The primary purpose of a capacitor is storing charge so that the importance of having high band gap at the interface to the conductor may be more important than even for a transistor.

While the invention has been described in various embodiments, there may be other embodiments and other materials that may be used in combination that will provide the benefit or some of the benefits that are associated with this invention. Other materials than those mentioned may be used. In addition, there may be materials that can be added to lanthanum aluminate that may provide benefits as well in addition to those provided by the lanthanum aluminate in the combinations and the various concentrations that are described. Accordingly, it is the claims that define the scope of this invention.

What is claimed is:

1. A semiconductor structure comprising:

a semiconductor substrate;

a dielectric layer comprising lanthanum, aluminum, and oxygen over the semiconductor substrate;

an electrode layer over the dielectric layer; and an interfacial layer between the semiconductor substrate and the dielectric layer;

wherein the interfacial layer comprises oxygen and aluminum.

2. The semiconductor structure of claim 1 wherein the dielectric layer is lanthanum aluminate.

3. The semiconductor structure of claim 1 wherein the dielectric layer is amorphous.

4. The semiconductor structure of claim 1 wherein the semiconductor substrate is selected from a group consisting of monocrystalline silicon, gallium arsenide, silicon on insulator, silicon germanium and germanium.

5. The semiconductor structure of claim 1, wherein the electrode layer is a gate electrode.

6. The semiconductor structure of claim 1 wherein one element of the dielectric layer is graded from zero to an amount greater than zero.

7. The semiconductor structure of claim 6, wherein the amount is stoichiometric.

8. A semiconductor structure comprising:
a first conductive layer;
a dielectric layer comprising lanthanum, aluminum, and oxygen over the first conductive layer;
a second conductive layer over the dielectric layer;
a first interfacial layer between the first conductive layer and the dielectric layer; and
a second interfacial layer between the dielectric layer and the second conductive layer;
wherein the first interfacial layer comprises oxygen and aluminum.

9. The semiconductor structure of claim 8, wherein the second conductive layer is a floating gate.

10. The semiconductor structure of claim 8, wherein the dielectric layer is lanthanum aluminate.

11. The semiconductor structure of claim 8 wherein the dielectric layer is amorphous.

12. The semiconductor structure of claim 8 wherein the second interfacial layer comprises an element selected from the group consisting of silicon, nitrogen, oxygen, and aluminum.

13. The semiconductor structure of claim 8 wherein the first interfacial layer and second interfacial layer are the same material.

14. The semiconductor structure of claim 8, wherein the dielectric layer is graded from both the first conductive layer and the second conductive layer from zero to an amount.

15. The semiconductor structure of claim 14, wherein the amount is stoichiometric.

16. A method for forming a semiconductor structure comprising:
forming a dielectric layer comprising lanthanum, aluminum, and oxygen over a semiconductor substrate by atomic layer chemical vapor deposition;
forming an electrode layer over the dielectric layer; and
forming a first interfacial layer between the semiconductor substrate and the dielectric layer;
wherein the first interfacial layer comprises oxygen and aluminum.

17. The method of claim 6 further comprising forming an interfacial layer between the semiconductor substrate and the dielectric layer.

18. The method of claim 16 further comprising forming a second interfacial layer between the dielectric layer and the electrode layer over the dielectric layer.

19. A semiconductor device, comprising:
a first material selected from a substrate having a semiconductor surface and a conducting layer;
a second material, said second material being a layer which is conductive;
a third material disposed between the first and second material and comprising lanthanum, aluminum, and oxygen, wherein said third material is amorphous; and
a fourth material disposed between the third material and the first material, said fourth material comprising oxygen and aluminum.

* * * * *